(12) United States Patent
Ikeda

(10) Patent No.: US 6,661,703 B1
(45) Date of Patent: Dec. 9, 2003

(54) MAGNETO-RESISTANCE EFFECT FILM AND MEMORY USING IT

(75) Inventor: Takashi Ikeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/157,927

(22) Filed: May 31, 2002

(30) Foreign Application Priority Data

Jun. 7, 2001 (JP) ........................................ 2001/172567

(51) Int. Cl.$^7$ ................................................. G11C 11/00
(52) U.S. Cl. ........................ 365/158; 365/171; 365/173; 428/141
(58) Field of Search ................................. 365/158, 171, 365/173; 428/141

(56) References Cited

U.S. PATENT DOCUMENTS 5,585,198 A  * 12/1996 Maeda et al. ................ 428/611
5,738,929 A  *  4/1998 Maeda et al. ................ 428/141
6,219,275 B1    4/2001 Nishimura .................... 365/173

FOREIGN PATENT DOCUMENTS

JP         11-213650           8/1999

* cited by examiner

Primary Examiner—Van Thu Nguyen
(74) Attorney, Agent, or Firm—Fitzpatrick, Cella, Harper & Scinto

(57) ABSTRACT

The magneto-resistance effect film of the present invention comprises a first magnetic layer consisting of a perpendicularly magnetized film; a second magnetic layer consisting of a perpendicularly magnetized film stacked above said first magnetic layer; a non-magnetic layer sandwiched between said first and second magnetic layers; and a first magnetic region formed in granular shape between one of said first and second magnetic layers and the non-magnetic layer and having a spin polarization greater than that of the one of the first and second magnetic layers, wherein said first magnetic region is exchange-coupled with the one of the first and second magnetic layers.

17 Claims, 6 Drawing Sheets

MAGNETO-RESISTANCE EFFECT FILM AND MEMORY USING IT

BACKGROUND OF THE INVENTION

1. Field of the Invention

The present invention relates to a magneto-resistance effect film and a memory using it.

2. Related Background Art

In recent years, semiconductor memories as solid-state memories are frequently used in information technology apparatus and there are various types of memories including Dynamic Random Access Memory (DRAM), Ferroelectric Random Access Memory (FeRAM), flash Electrically Erasable Programmable Read-Only Memory (EEPROM), and so on. The features of these semiconductor memories include both merits and demerits and there exists no memory satisfying all the specifications required by the present information apparatuses. For example, the DRAM has high recording density and the large number of rewritable times, but is a volatile memory, which loses information without supply of power. The flash EEPROM is non-volatile, but it requires a long time for erasing of information and thus is unsuitable for fast processing of information.

In contrast to the semiconductor memories described above, Magneto-Resistance Effect Random Access Memory (MRAM) is a potential memory that can satisfy all the specifications required by many information apparatuses as to recording time, readout time, recording density, the number of rewritable times, power consumption, and so on. Particularly, MRAM making use of the Spin-dependent Tunnel Magneto-Resistance (TMR) effect yields large readout signals and is thus advantageous in achievement of higher recording density or in fast readout, and the practicability thereof as MRAM was substantiated in recent research reports.

The basic configuration of the magneto-resistance effect film used as an element of MRAM is a sandwich structure in which two magnetic layers are adjacently formed through a non-magnetic layer. Materials often used for the non-magnetic film are Cu and $Al_2O_3$. The magneto-resistance effect film with the non-magnetic layer made of such a conductor as Cu or the like is called a Giant Magneto-Resistance (GMR) film, and the magneto-resistance effect film with the non-magnetic layer made of such an insulator as $Al_2O_3$ or the like is called a Spin-dependent Tunnel Magneto-Resistance (TMR) film. In general, the TMR film demonstrates the greater magneto-resistance effect than the GMR film.

With decrease in element size in order to enhance the recording density of MRAM, the MRAM using in-plane-magnetized films comes to face a problem of failure in retention of information because of influence of demagnetizing fields or curling of magnetization at end faces. In order to circumvent this problem, for example, there is a method of forming the magnetic layers in rectangular shape, but this method does not allow decrease in the element size. Therefore, much improvement in the recording density cannot be expected by that method. A suggestion was thus made to circumvent the above problem by the use of perpendicularly magnetized films, for example, as described in Japanese Patent Application Laid-Open No. 11-213650 (U.S. Pat. No. 6,219,275). In this method the demagnetizing fields do not increase even with decrease in the element size, and it is thus feasible to realize the magneto-resistance effect film in smaller size than the MRAM using the in-plane-magnetized films.

In the case of the magneto-resistance effect film using the perpendicularly magnetized films, the electrical resistance of the magneto-resistance effect film is relatively small in a state in which directions of magnetizations in the two magnetic layers are parallel to each other, but the electrical resistance is relatively large in a state in which the directions of magnetizations are antiparallel to each other, as in the case of the magneto-resistance effect film using the in-plane-magnetized films. FIGS. 1A to 1D are illustrations for explaining the relationship between magnetized states of the magneto-resistance effect film using the perpendicularly magnetized films and magnitude of resistance. In FIGS. 1A to 1D, each magneto-resistance effect film consists of a first magnetic layer (readout layer) 21, a second magnetic layer (recording layer) 23 stacked above the readout layer 21 and made of a perpendicularly magnetized film having a higher coercive force than the readout layer 21, and a non-magnetic layer 22 sandwiched between these layers. Arrows described in the readout layer 21 and the recording layer 23 indicate directions of magnetizations in the respective layers. It is assumed in the present example that the upward magnetization direction in the recording layer 23 represents "1" and the downward direction represents "0".

When the directions of magnetizations in the two layers both are upward as shown in FIG. 1A, the electrical resistance of the magneto-resistance effect film is relatively small. When the direction of magnetization in the readout layer 21 is downward and the direction of magnetization in the recording layer 23 is upward as shown in FIG. 1C, the electrical resistance becomes relatively large. Accordingly, when an external magnetic field is applied so as to direct the magnetization upward in the readout layer 21 in the recording state of "1" and thereafter another external magnetic field is applied so as to direct the magnetization downward in the readout layer 21, the electrical resistance of the magneto-resistance effect film changes to increase. This change allows the information of "1" to be read out. However, the external magnetic fields applied in the readout operation should be of such strength as not to change the direction of magnetization in the recording layer 23. On the other hand, the electrical resistance is relatively large in a state in which the direction of magnetization in the readout layer 21 is upward and the direction of magnetization in the recording layer 23 is downward as shown in FIG. 1B, whereas the electrical resistance is relatively small in a state in which the directions of magnetizations in the two magnetic layers both are downward as shown in FIG. 1D. Accordingly, when the readout operation similar to the above is carried out in the recording state of "0", the electrical resistance changes to decrease. Therefore, this change allows the information of "0" to be read out.

Materials mainly used as the perpendicularly magnetized films for the readout layer and recording layer described previously, include alloy films and artificial lattice films of at least one element selected from the rare earth metals such as Gd, Dy, Tb, etc. and at least one element selected from the transition metals such as Co, Fe, Ni, etc.; artificial lattice films of transition metal and noble metal, e.g., Co/Pt and others; alloy films with magnetocrystalline anisotropy in the direction perpendicular to the film surface, e.g., CoCr and others. Among these materials, the amorphous alloys of a rare earth metal and a transition metal are easiest to form the perpendicularly magnetized films and are suitable for use in the memory elements. Particularly, the amorphous alloys containing Gd as the rare earth metal are more preferably applicable to the memory elements, because it is possible to decrease the coercive force and the magnetic field for saturation.

Incidentally, in order to achieve the great magneto-resistance effect, it is necessary to place a magnetic material with a large spin polarization at the interface with the non-magnetic film. There is, however, a problem that the great magneto-resistance effect cannot be attained in the magneto-resistance effect film of three-layer structure in which the non-magnetic film is sandwiched between the magnetic films made of the amorphous alloys containing Gd as described above. A conceivable reason for it is that there exist Gd atoms at the interface with the non-magnetic film. Namely, 4f electrons are responsible for the magnetization of Gd and are different from conduction electrons. When such atoms exist at the interface with the non-magnetic layer, electrons colliding with Gd atoms do not undergo spin scattering in the case of the GMR film or do not undergo spin tunneling in the case of the TMR film. Accordingly, the total magneto-resistance effect appears insignificant in the magneto-resistance effect film.

SUMMARY OF THE INVENTION

An object of the present invention is to solve the problems in the conventional art and provide a magneto-resistance effect film with the great magneto-resistance effect and a memory using it.

The above object of the present invention is achieved by a magneto-resistance effect film comprising: a first magnetic layer consisting of a perpendicularly magnetized film; a second magnetic layer consisting of a perpendicularly magnetized film stacked above the first magnetic layer; a non-magnetic layer sandwiched between the first and second magnetic layers; and a first magnetic region formed in granular shape between one of the first and second magnetic layers and the non-magnetic layer and having a spin polarization greater than that of the one of the first and second magnetic layers, wherein the first magnetic region is exchange-coupled with the one of the first and second magnetic layers. The object of the present invention is also achieved by a memory comprising: a memory element consisting of a magneto-resistance effect film; means for recording information in the memory element; and means for reading information recorded in the memory element, wherein the magneto-resistance effect film comprises: a first magnetic layer consisting of a perpendicularly magnetized film; a second magnetic layer consisting of a perpendicularly magnetized film stacked above the first magnetic layer; a non-magnetic layer sandwiched between the first and second magnetic layers; and a first magnetic region formed in granular shape between one of the first and second magnetic layers and the non-magnetic layer and having a spin polarization greater than that of the one of the first and second magnetic layers, wherein the first magnetic region is exchange-coupled with the one of the first and second magnetic layers.

DETAILED DESCRIPTION OF THE PREFERRED EMBODIMENTS

Figure 1A:
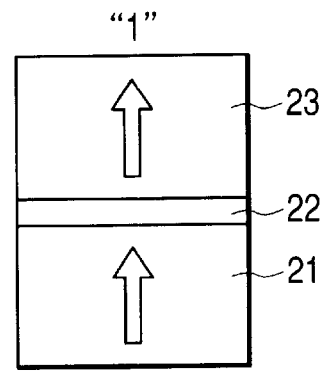
FIGS. 1A, 1B, 1C, and 1D are illustrations for explaining the relationship between magnetized states of the magneto-resistance effect film and magnitude of resistance.
Figure 1B:
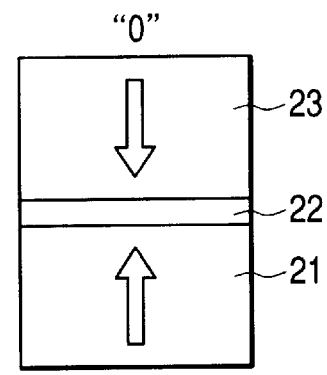
Figure 1C:
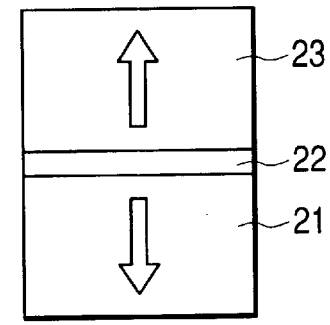
Figure 1D:
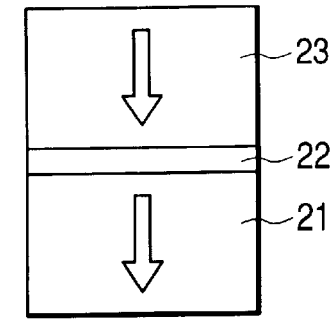
Figure 2:
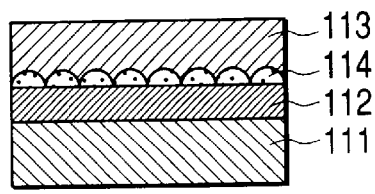
FIG. 2 is a schematic, sectional view showing the first embodiment of the magneto-resistance effect film of the present invention.

FIG. 2 is a schematic, sectional view showing the first embodiment of the magneto-resistance effect film according to the present invention. In FIG. 2, a second magnetic layer 113 is stacked through a non-magnetic layer 112 above a first magnetic layer 111. Namely, the non-magnetic layer 112 is sandwiched between the first magnetic layer 111 and the second magnetic layer 113. A first magnetic region 114 of granular shape is formed at the interface between the second magnetic layer 113 and the non-magnetic layer 112. The first magnetic region 114 has a spin polarization greater than that of the second magnetic layer 113. The first magnetic region 114 is exchange-coupled with the second magnetic layer 113.

The perpendicularly magnetized films making up the first magnetic layer 111 and the second magnetic layer 113 are preferably made of amorphous alloys of a rare earth metal and a transition metal. The non-magnetic layer 112 is preferably made of Cu or $Al_2O_3$. The first magnetic region 114 is made of a material of granular shape and with a high spin polarization, for example, Co or a CoFe alloy. Normally, Co or the CoFe alloy itself does not demonstrate great perpendicular magnetic anisotropy. Therefore, when it is formed in film shape, magnetization is directed in the in-plane directions of the film because of the influence of demagnetizing fields. Thus a high energy is necessary for directing the magnetization in the direction perpendicular to the film surface. However, when such magnetic materials as Co, the CoFe alloy, and so on are formed in spherical shape, there is no shape anisotropy and thus the magnetization can be directed in any direction relatively easily. It is difficult in practice to form the magnetic materials in perfectly spherical shape, but these magnetic materials formed in the granular shape can achieve the effect similar to that in the case of those formed in the spherical shape. The shape of the magnetic materials differs depending upon formation methods, formation conditions, and states of the underlying layer. The magnetic materials can be formed easier in the granular form by means of evaporation rather than sputtering.

FIG. 2 shows the configuration wherein the first magnetic region 114 is formed at the interface between the non-magnetic layer 112 and the second magnetic layer 113, but a magnetic region made of a material with a high spin polarization as described above may be formed at the interface between the non-magnetic film 112 and the first magnetic layer 111. Further, magnetic regions made of materials with a high spin polarization may be formed as a first magnetic region and a second magnetic region, respectively, at the interface between the first magnetic layer 111 and the non-magnetic layer 112 and at the interface between the second magnetic layer 113 and the non-magnetic layer 112. The magneto-resistance effect appears more outstanding in the configuration with the magnetic regions at the both interfaces than in the configuration with the magnetic region at either one interface.

In the magnetic region formed at the interface between the first magnetic layer 111 and the non-magnetic layer 112 or at the interface between the second magnetic layer 113 and the non-magnetic layer 112, the magnetization is preferably directed in the direction perpendicular to the film surface in a magnetic field of zero, i.e., in a state without application of a magnetic field from the outside. When the magnetization in the magnetic region as described is inclined relative to the direction perpendicular to the film surface, it is preferable that the magnetization in the magnetic region be readily directed into the direction perpendicular to the film surface with application of a magnetic field in the direction perpendicular to the film surface. When the magneto-resistance effect film of the present invention is applied to a memory element, means for applying the magnetic field to the magneto-resistance effect film in recording or readout operation is often means for flowing an electric current through a conductor to apply a magnetic field generated by the electric current, to the film. This conductor is normally made of Al or an Al alloy, and there is a limit of current density. Therefore, there is also a limit of strength of the magnetic field that can be applied to the magneto-resistance effect film of the memory element. The strength of the magnetic field that can be actually applied to the memory element differs depending upon the structure of memory cell, but the limit is approximately 4 kA/m. Accordingly, the magnetization in the magnetic region formed at the interface between the first magnetic layer and the non-magnetic layer or at the interface between the second magnetic layer and the non-magnetic layer needs to be directed in the direction perpendicular to the film surface in a state in which the magnetic field of not more than 4 kA/m is applied from the outside.

In the magneto-resistance effect film, the two or more magnetic layers are stacked through the non-magnetic layer several nm thick, and a magnetostatic coupling force acts between the two magnetic layers. Particularly, since the non-magnetic layer of the TMR film is a superthin film about 2 nm thick, the magnetostatic coupling force becomes extremely large if the strength of the magnetization in the magnetic layers is high. Then magnetization reversal in the two magnetic layers can be caused by the applied magnetic field of the same strength in certain cases. When the magnetic material with strong magnetization such as Co, the CoFe alloy, or the like is placed so as to contact the interface of the non-magnetic layer as in the case of the magneto-resistance effect film of the present invention, a large magnetostatic coupling force is expected to act. A method of decreasing the magnetostatic coupling force can be a method in which the magnetization in the first magnetic layer or in the second magnetic layer is directed in the direction opposite to the magnetization in the first or second magnetic region formed at the interface to decrease the strength of the resultant magnetic field of the magnetization in the magnetic layer and the magnetization in the magnetic region (the magnetic material of granular shape). For example, in the case where the magnetic material of the granular shape is CoFe and the first or second magnetic layer is GdFe, it can be achieved when the composition of the magnetic layer is rare-earth (Gd)-sublattice-magnetization-dominant. When the CoFe film (magnetic region) is exchange-coupled with the GdFe film (magnetic layer), spins of Co atoms and spins of Fe atoms in the CoFe film are parallel to spins of Fe atoms in the GdFe film, but are antiparallel to spins of Gd atoms. Accordingly, when the composition is Gd-sublattice-magnetization-dominant, the direction of the magnetization in the GdFe film becomes antiparallel to the direction of the magnetization in the CoFe film, so that the resultant magnetization of the two magnetic materials becomes low in strength.

There are two types of conceivable configurations in application of the magneto-resistance effect film to the memory element: a configuration wherein the magnetization in one of the two magnetic layers formed in contact with the non-magnetic layer is reversed by the magnetic field applied in the recording operation, but the magnetization in the other magnetic layer is not reversed; and a configuration wherein the magnetizations in the two magnetic layers both are reversed. However, in the case where the magnetizations in the two magnetic layers both are reversed, the magnetic fields necessary for reversing the magnetizations in the respective magnetic layers are different in strength. Namely, when the magneto-resistance effect film shown in FIG. 2 is applied to the memory element, the first magnetic layer 111 and the second magnetic layer 113 need to have mutually different coercive forces. It is common practice to use one with a larger coercive force out of these magnetic layers, as a recording layer, and use the other with a smaller coercive force as a readout layer.

When a magneto-resistance effect film with only one of the magnetic layers being magnetization-reversible is used as a memory element, in order to read out the recorded information in a nondestructive manner, the electrical resistance of the magneto-resistance effect film is compared, for example, with a resistance value of a fixed resistor while maintaining the magnetization state of the magneto-resistance effect film, to determine whether it is larger or smaller than the fixed resistance value.

In the case where the magnetizations in the two magnetic layers both are reversible, information is recorded in the magnetic layer that undergoes magnetization reversal with a relatively strong magnetic field and the recorded information is read out by reversing the magnetization in the other magnetic layer and detecting a change of resistance at that time.

For changing the direction of magnetization in the magneto-resistance effect film, the magnetic field is applied in the direction perpendicular to the film surface. Where the magneto-resistance effect film is the memory element, the magnetic field applied in the direction perpendicular to the film surface is a magnetic field in a direction determined based on information to be recorded. Accordingly, the magnetic field applied in the direction perpendicular to the film surface needs to be one capable of readily changing the direction thereof. For this reason, the memory using the magneto-resistance effect film is normally configured so that the magnetic field applied in the direction perpendicular to the film surface is generated by an electric current flowing through a conductor and that the direction of the magnetic field is switched to the other by changing the direction of the electric current.

It is also possible to decrease the strength of the magnetic field applied to the magneto-resistance effect film, by applying a magnetic field in an arbitrary direction among in-plane directions of the film, in addition to the magnetic field in the perpendicular direction to the film surface. Application of this method allows selective recording in any memory element. The magnetic field applied in the in-plane direction may be generated, for example, by the use of a permanent magnet, or by a method of placing a conductor above or below the magneto-resistance effect film and applying a magnetic field generated thereby, to the film. Further, a wire for applying the in-plane magnetic field can also be used as a bit line in the memory.

EXAMPLE 1

Figure 3:
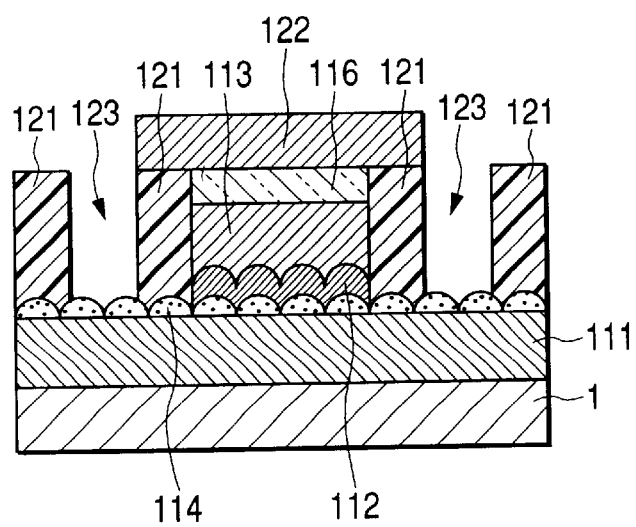
FIG. 3 is a schematic, sectional view showing the second embodiment of the magneto-resistance effect film of the present invention.

FIG. 3 is a schematic, sectional view showing the second embodiment of the magneto-resistance effect film according to the present invention. In FIG. 3, reference numeral 1 designates a silicon substrate, 111 a first magnetic layer also serving as a lower electrode, 112 a non-magnetic layer, 113 a second magnetic layer, 114 a first magnetic region, 116 a protective film, 121 insulating films, and 122 an upper electrode. In the present example, the magnetic region 114 with a spin polarization larger than that of the first magnetic layer 111 is formed in granular shape between the first magnetic layer 111 and the non-magnetic layer 112. The first magnetic region 114 is exchange-coupled with the first magnetic layer 111.

The magneto-resistance effect film shown in FIG. 3 was produced according to the process as described below. First, the silicon substrate 1 was placed in a vacuum chamber, and a perpendicularly magnetized film consisting of Gd-sublattice-magnetization-dominant $Gd_{26}Fe_{74}$ was formed as the first magnetic layer 111 in the thickness of 50 nm on the substrate 1 by sputtering. Subsequently, while the vacuum chamber was maintained in a vacuum state, a plurality of Co zones were formed as the first magnetic region 114 in the granular shape with the average diameter of about 2.5 nm on the surface of the first magnetic layer 111 by evaporation. Further, an $Al_2O_3$ film was formed as the non-magnetic layer 112 in the thickness of 1.5 nm on the first magnetic region 114 by sputtering and thereafter the substrate was exposed to the atmosphere to effect native oxidation.

Then the substrate 1 was again carried into the vacuum chamber and a film of Fe-sublattice-magnetization-dominant $Tb_{19}Fe_{81}$ was formed as the second magnetic layer 113 in the thickness of 30 nm on the non-magnetic film 112 by sputtering. Further, a Pt film was formed as the protective film 116 in the thickness of 5 nm on the second magnetic layer 113.

Subsequently, a first resist layer was formed in the size of 1 μm×1 μm on the layers stacked as described above, and the $Tb_{19}Fe_{81}$ film was removed from regions other than the region below the first resist layer by a milling system. Then an $Al_2O_3$ film was formed as an insulating film 121 in the thickness of 30 nm. After that, the first resist layer and the $Al_2O_3$ film deposited thereon were removed. Then a second resist layer was formed in a dumbbell-bored pattern, an Al film was deposited thereon, and thereafter the second resist layer was lifted off, thereby forming the upper electrode 122 of dumbbell shape. Further, in order to connect a contact current source and a voltmeter to the first magnetic layer (lower electrode) 111, a part of the insulating film 121 was removed by ion milling, thereby forming contact holes 123.

The contact current source and voltmeter were connected to the magneto-resistance effect film produced as described above to measure a change rate of magnetic resistance of the magneto-resistance effect film, and the result of the measurement was 30%.

COMPARATIVE EXAMPLE

Figure 4:
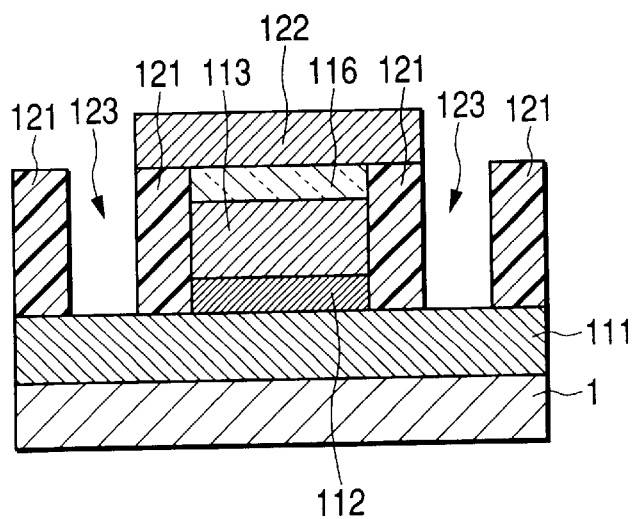
FIG. 4 is a schematic, sectional view showing a comparative example of the magneto-resistance effect film.

FIG. 4 is a schematic, sectional view showing a comparative example of the magneto-resistance effect film. The magneto-resistance effect film of FIG. 4 has the same configuration as the magneto-resistance effect film shown in FIG. 3, except that it is not provided with the first magnetic region 114. Therefore, in FIG. 4 the same reference symbols denote the same members as in FIG. 3 and detailed description thereof is omitted herein.

The magneto-resistance effect film of FIG. 4 was produced according to the same method and the same procedure as in Example 1, except for omission of the step of forming the first magnetic region 114 by vacuum evaporation. A change rate of magnetic resistance of the magneto-resistance effect film thus produced was measured by the same method as in Example 1, and the result was 1.8%.

EXAMPLE 2

Figure 5:
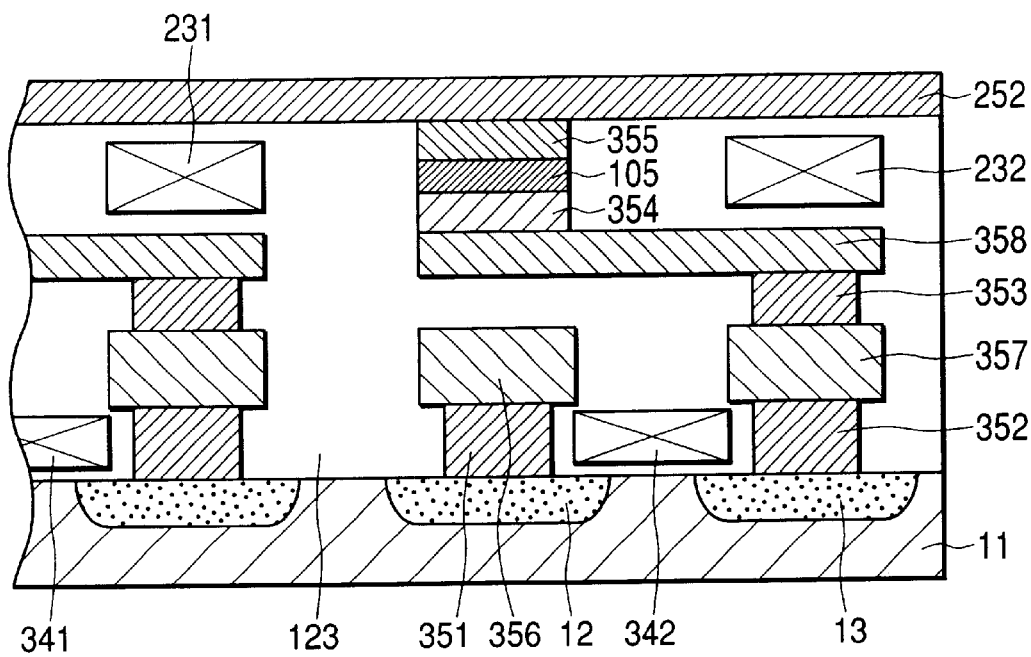
FIG. 5 is a schematic, sectional view showing a part of a memory using the magneto-resistance effect film of the present invention.

FIG. 5 is a schematic, sectional view showing a part of a memory using the magneto-resistance effect film of the present invention. In FIG. 5, numeral 11 designates a p-type silicon substrate. Two n-type diffusion regions 12 and 13 were formed in this substrate 11. Then a word line (gate electrode) 342 was placed through an insulating film 123 between these regions 12 and 13, thus forming a transistor.

A ground line 356 was connected through a contact plug 351 to the n-type diffusion region 12. The magneto-resistance effect film 105 was connected through contact plugs 352, 357, 353, 354 and a local wire 358 to the n-type diffusion region 13. The magneto-resistance effect film 105 was connected through a contact plug 355 to a bit line 252. Further, a conductor 232 for generating a magnetic field was provided at the side of the magneto-resistance effect film 105. In the present example, the memory is comprised of a plurality of memory elements, each consisting of a unit of the configuration as described above, in a matrix pattern on the same and one silicon substrate. In FIG. 5, numeral 341 denotes a word line (gate electrode) for an adjacent memory element, and numeral 231 denotes a conductor for the adjacent memory element.

Figure 6:
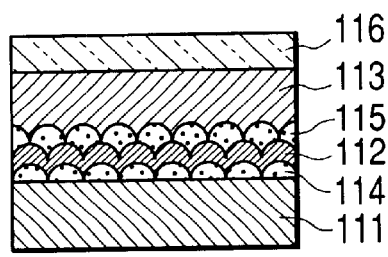
FIG. 6 is a schematic, sectional view showing a configuration of the magneto-resistance effect film used in the memory of FIG. 5.

FIG. 6 is a schematic, sectional view showing the configuration of the magneto-resistance effect film 105 used in the memory of FIG. 5. In FIG. 6, numeral 111 designates a first magnetic layer, 112 a non-magnetic layer, 113 a second magnetic layer, 114 a first magnetic region, 115 a second magnetic region, and 116 a protective film.

The magneto-resistance effect film shown in FIG. 6 was produced according to the process as described below. First, a perpendicularly magnetized film of Gd-sublattice-magnetization-dominant $Gd_{26}Fe_{74}$ was formed as the first magnetic layer 111 in the thickness of 50 nm. Then Co areas were formed as the first magnetic region in the granular shape with the average diameter of about 2.5 nm on the first magnetic layer 111. Subsequently, an $Al_2O_3$ film was formed as the non-magnetic layer 112 in the thickness of 1.5 nm on the first magnetic region. Then Co areas were formed as the second magnetic region 115 in the granular shape with the average diameter of about 2.5 nm on the non-magnetic layer 112. Further, a film of Tb-sublattice-magnetization-dominant $Tb_{27}Fe_{73}$ was formed as the second magnetic layer 113 in the thickness of 30 nm on the second magnetic region 115. Finally, a Pt film was formed as the protective film 116 in the thickness of 5 nm on the second magnetic layer 113.

Figure 7:
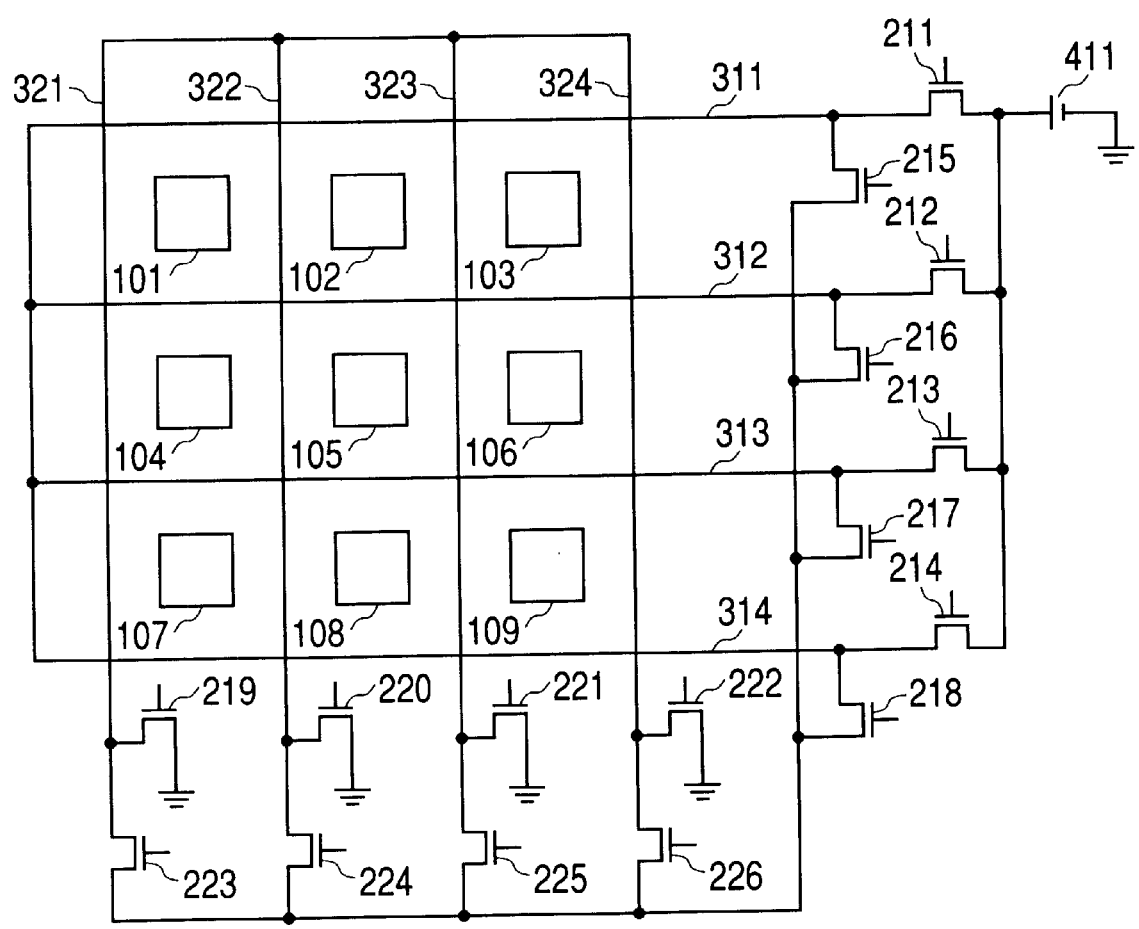
FIG. 7 is a circuit diagram of write lines for recording information in the memory of FIG. 5.

The following will describe the operation of recording information in the memory of FIG. 5. FIG. 7 is a circuit diagram of write lines for recording in the memory of FIG. 5. In FIG. 7, numerals 101 to 109 each represent the magneto-resistance effect films formed in a matrix pattern of 3 rows×3 columns. Near the magneto-resistance effect films 101 to 109, conductors 311, 312, 313 and 314 are juxtaposed in the row direction, and conductors 321, 322, 323 and 324 in the column direction. The conductors 311, 312, 313 and 314 are connected to each other at their one ends and connected to each other through respective transistors 211, 212, 213 and 214 at their other ends to be connected to a power supply 411. On the other hand, the conductors 321, 322, 323 and 324 are connected to each other at their one ends and are connected to each other through respective transistors 223, 224, 225 and 226 at their other ends. The other ends of the conductors 321 to 324 connected are connected through respective transistors 215, 216, 217 and 218 to the conductors 311, 312, 313 and 314. The conductors 321, 322, 323 and 324 are grounded through respective transistors 219, 220, 221 and 222.

In FIG. 7, for example, in the case where the magnetization in the magneto-resistance effect film 105 is selectively reversed, the transistors 212, 217, 225 and 220 are switched on and the other transistors are switched off. Then the electric current flows through the conductors 312, 313, 323 and 322 to generate magnetic fields around these conductors. Therefore, the magnetic fields of the same direction from the four conductors are applied to only the magneto-resistance effect film 105. At this time, the resultant magnetic field of these magnetic fields is adjusted so as to be slightly stronger than the magnetic field for magnetization reversal of the magnetic films of the elements, whereby only the magnetization in the magneto-resistance effect film 105 can be selectively reversed. For applying the magnetic fields in the direction opposite to that in the above case to the magneto-resistance effect film 105, the transistors 213, 216, 224 and 221 are switched on, and the other transistors are switched off. In this case, the electric current flows in the direction opposite to that in the above case through the conductors 312, 313, 323 and 322 to apply the magnetic fields of the opposite direction to the magneto-resistance effect film 105.

Figure 8:
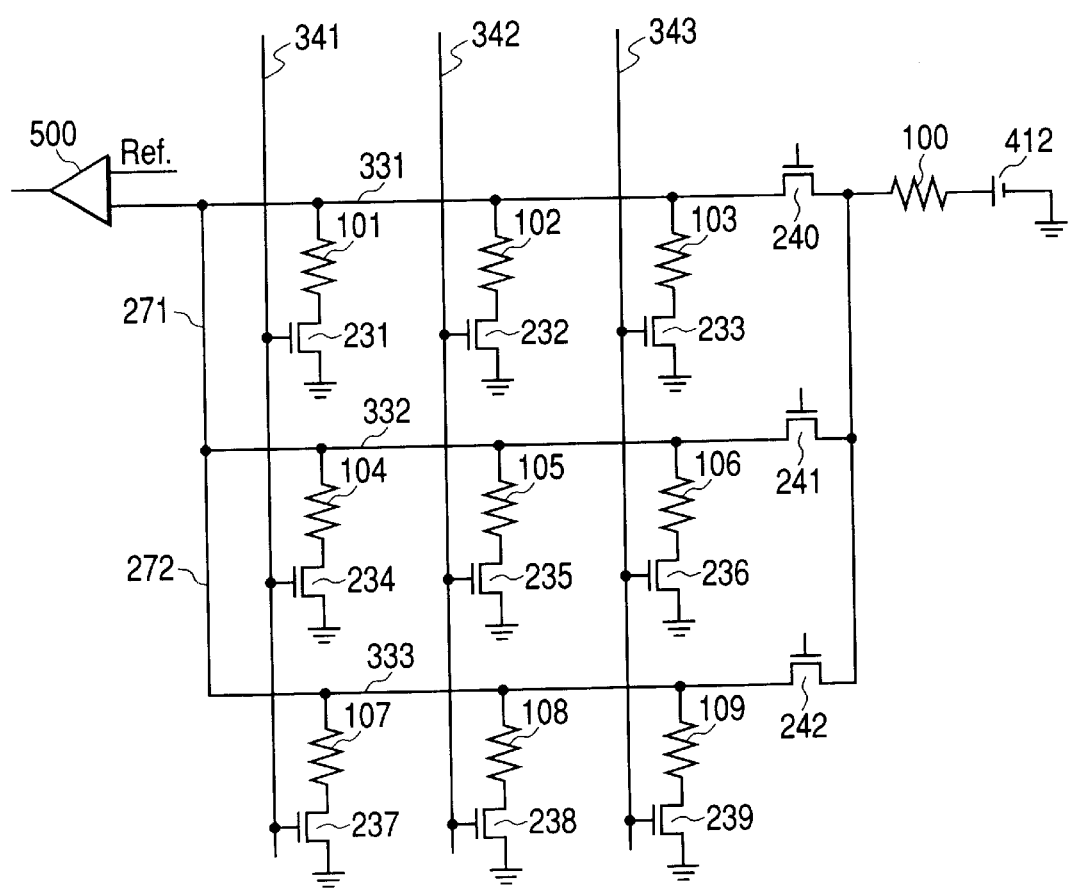
FIG. 8 is an electrical circuit diagram for reading information recorded in the memory of FIG. 5.

The following will describe the operation of reading information out of the memory of FIG. 5. FIG. 8 is an electric circuit diagram for readout of information recorded in the memory of FIG. 5. In FIG. 8, numerals 101 to 109 represent the magneto-resistance effect films formed in a matrix pattern of 3 rows×3 columns. The magneto-resistance films 101 to 109 are connected at their one ends to collectors of transistors 231 to 239, respectively. Emitters of the transistors 231 to 239 are grounded. Among the magneto-resistance effect films 101 to 109, the other ends of the magneto-resistance effect films in each row are connected each to a bit line 331, 332, or 333. These bit lines 331 to 333 are connected to each other at their one end by conductors 271 and 272 to be connected to one input terminal of sense amplifier 500. A reference voltage (Ref.) is applied to the other input terminal of the sense amplifier 500.

On the other hand, the other ends of the bit lines 331, 332 and 333 are connected to each other through respective transistors 240, 241 and 242 to be connected through a fixed resistor 100 to a power supply 412. Among the transistors 231 to 239, gate electrodes of transistors in each column are connected to word lines 341, 342 and 343, respectively.

In FIG. 8, for example, where the information recorded in the magneto-resistance effect film 105 is read out, the transistor 235 and transistor 241 are switched on. This establishes a circuit in which the power supply 412, fixed resistor 100, and magneto-resistance effect film 105 are connected in series. For this reason, the power-supply voltage is divided to the fixed resistor 100 and the magneto-resistance effect film 105 at voltages corresponding to a ratio of the resistance of the fixed resistor 100 and the resistance of the magneto-resistance effect film 105. Since the power-supply voltage is fixed, the voltage of the magneto-resistance effect film varies as the resistance of the magneto-resistance effect film varies. This variation of voltage is detected by the sense amplifier 500 to read the information.

EXAMPLE 3

Figure 9:
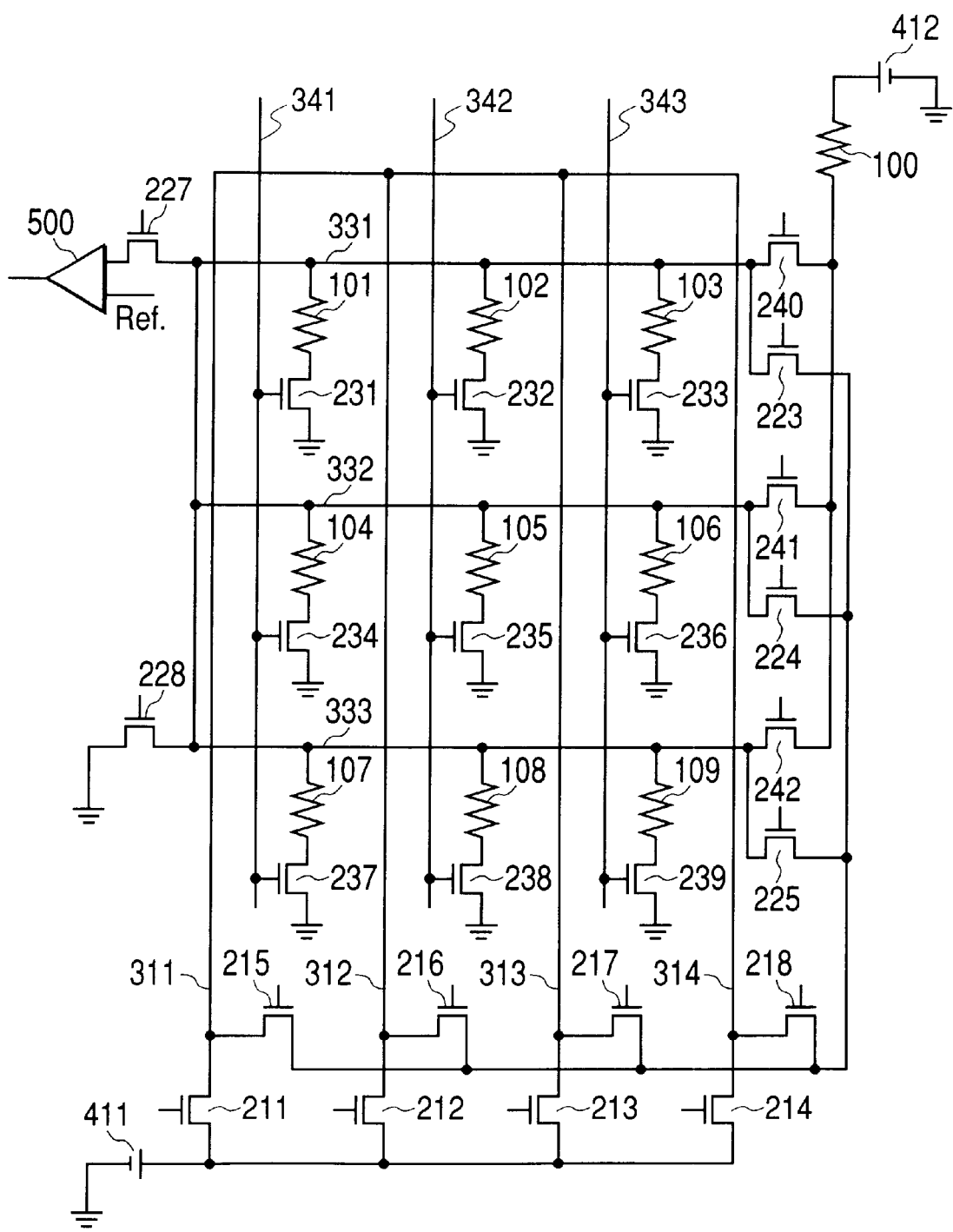
FIG. 9 is a diagram showing an electric circuit for recording information in the memory using the magneto-resistance effect film of the present invention and for reading information recorded in the memory.

FIG. 9 is a diagram showing an electric circuit for recording information in a memory using the magneto-resistance effect film of the present invention and for reading information recorded in the memory. A difference from Example 2 is that the X-directional write lines are excluded out of the X-directional and Y-directional write lines for generation of magnetic fields in the direction perpendicular to the film surface, located beside the memory elements. In the present example, the electric current is flowed through a bit line in the recording operation to generate a magnetic field in an in-place direction of the film, and a resultant magnetic field of the magnetic field from the write line for generation of the magnetic field in the direction perpendicular to the film surface and the magnetic field in the in-plane direction of the film from the bit line is applied to change the direction of magnetization in a desired memory element.

In FIG. 9, numerals 101 to 109 represent the magneto-resistance effect films formed in a matrix pattern of 3 rows×3 columns. Each magneto-resistance effect film has the configuration as shown in FIG. 5. The magneto-resistance films 101 to 109 are connected at their one ends to collectors of transistors 231 to 239, respectively. The emitters of the transistors 231 to 239 are grounded. Among the magneto-resistance effect films 101 to 109, the other ends of the magneto-resistance effect films in each row are connected to a bit line 331, 332 and 333, respectively. These bit lines 331 to 333 are connected to each other at their one ends to be connected through a transistor 227 to one input terminal of sense amplifier 500. The reference voltage (Ref.) is applied to the other input terminal of the sense amplifier 500. The bit lines 331 to 333 connected to each other are grounded at one end through a transistor 228.

On the other hand, the other ends of the bit lines 331, 332 and 333 are connected to each other through respective transistors 240, 241 and 242 to be connected through a fixed resistor 100 to a power supply 412. Among the transistors 231 to 239, gate electrodes of transistors in each column are connected each to word lines 341, 342 and 343, respectively.

Conductors (write lines) 311, 312, 313 and 314 along the column direction are juxtaposed near the magneto-resistance effect films 101 to 109. The conductors 311, 312, 313 and 314 are connected to each other at their one ends and are connected to each other at their other ends through respective transistors 211, 212, 213 and 214 to be connected to a power supply 411. The other ends of the conductors 311, 312, 313 and 314 are also connected to each other through respective transistors 215, 216, 217 and 218. The other ends thus connected are further connected through transistors 223, 224 and 225 to the respective bit lines 331, 332 and 333, respectively.

The following will describe the recording operation in the memory of the present example. For example, for selectively reversing the magnetization in the magneto-resistance effect film 105, the transistors 212, 217, 224 and 228 are switched on and the other transistors are switched off. In this case, the electric current flows through the write lines 312 and 313 to apply magnetic fields in the direction perpendicular to the film surface to the magneto-resistance effect film 105. On the other hand, the electric current also flows through the bit line 332 to apply a magnetic field in an in-plane direction of the film to the magneto-resistance effect film 105. Therefore, the magnetic fields in the in-plane direction of the film and in the perpendicular direction to the film surface are applied to only the magneto-resistance effect film 105, whereby only the magnetization in the magneto-resistance effect film 105 can be selectively reversed. For applying the magnetic fields in the opposite directions to the magneto-resistance effect film 105, the transistors 213, 216, 224 and 228 are switched on and the other transistors are switched off. In this case, the electric current flows through the bit line 332 and also flows in the direction opposite to that in the above case through the write lines 312 and 313 to apply the magnetic fields of the opposite directions to the magneto-resistance effect film 105.

The following will describe the operation of reading information out of the memory of the present example. For example, for reading the information recorded in the magneto-resistance effect film 105, the transistor 235 and the transistor 241 are turned on. This establishes a circuit in which the power supply 412, fixed resistor 100, and magneto-resistance effect film 105 are connected in series. Therefore, the power-supply voltage is divided to the fixed resistor 100 and the magneto-resistance effect film 105 at voltages corresponding to the ratio of the resistance of the fixed resistor 100 and the resistance of the magneto-resistance effect film 105. Since the power-supply voltage is fixed, the voltage of the magneto-resistance effect film also varies as the resistance of the magneto-resistance effect film varies. This variation of voltage is detected by the sense amplifier 500 to read the information.

As described above, the present invention has realized the magneto-resistance effect film with the great magneto-resistance effect and the memory using it on the basis of the provision of the magnetic region formed in the granular shape between at least one of the first and second magnetic layers and the non-magnetic layer and having the spin polarization greater than that of these magnetic layers.

The present invention permits a variety of changes and modifications in addition to the embodiments and examples described above. It is to be understood that the present invention embraces all such changes and modifications made without departing from the scope of the claims.

What is claimed is:

1. A magneto-resistance effect film comprising:
    a first magnetic layer consisting of a perpendicularly magnetized film;
    a second magnetic layer consisting of a perpendicularly magnetized film stacked above said first magnetic layer;
    a non-magnetic layer sandwiched between said first and second magnetic layers; and
    a first magnetic region formed in granular shape between one of said first and second magnetic layers and the non-magnetic layer and having a spin polarization greater than that of the one of the first and second magnetic layers, wherein said first magnetic region is exchange-coupled with the one of the first and second magnetic layers.

2. The magneto-resistance effect film according to claim 1, further comprising a second magnetic region formed in granular shape between the other of said first and second magnetic layers and the non-magnetic layer and having a spin polarization greater than that of the other of the first and second magnetic layers, wherein said second magnetic region is exchange-coupled with the other of said first and second magnetic layers.

3. The magneto-resistance effect film according to claim 2, wherein in a state without application of an external magnetic field, magnetization in the one of said first magnetic region and second magnetic region is directed in a direction perpendicular to the film surface, wherein in a state without application of an external magnetic field, magnetization in the other of said first magnetic region and second magnetic region is directed in a direction inclined from the direction perpendicular to the film surface, and wherein in a state with application of an external magnetic field in the direction perpendicular to the film surface, magnetizations in the first and second magnetic regions are directed both in the direction perpendicular to the film surface.

4. The magneto-resistance effect film according to claim 1, wherein said non-magnetic layer consists of an insulator.

5. The magneto-resistance effect film according to claim 1, wherein in a state without application of an external magnetic field, magnetization in said first magnetic region is directed in a direction perpendicular to the film surface.

6. The magneto-resistance effect film according to claim 1, wherein in a state without application of an external magnetic field, magnetization in said first magnetic region is directed in a direction inclined from a direction perpendicular to the film surface and wherein in a state with application of an external magnetic field in the direction perpendicular to the film surface, magnetization in the first magnetic region is directed in the direction perpendicular to the film surface.

7. The magneto-resistance effect film according to claim 1, wherein the one of said first and second magnetic layers consists of an amorphous alloy of a rare-earth-metal-sublattice-magnetization-dominant rare earth and a transition metal, and wherein said first magnetic region consists of a transition metal.

8. A memory comprising:
    a memory element consisting of a magneto-resistance effect film;
    means for recording information in said memory element; and
    means for reading information recorded in said memory element,
    wherein said magneto-resistance effect film comprises,
        a first magnetic layer consisting of a perpendicularly magnetized film,
        a second magnetic layer consisting of a perpendicularly magnetized film stacked above said first magnetic layer,
        a non-magnetic layer sandwiched between said first and second magnetic layers, and
        a first magnetic region formed in granular shape between one of said first and second magnetic layers and the non-magnetic layer and having a spin polarization greater than that of the one of the first and second magnetic layers, wherein said first magnetic region is exchange-coupled with the one of the first and second magnetic layers.

9. The memory according to claim 8, wherein said means for recording information consists of means for flowing an electric current through a conductor provided near said memory element, and wherein a magnetic field generated from the conductor is applied to the memory element, thereby implementing recording.

10. The memory according to claim 8, wherein said means for recording information applies a magnetic field in an in-plane direction of the film and a magnetic field in a direction perpendicular to the film surface to said memory element and determines an orientation of information to be recorded, by the magnetic field in the direction perpendicular to the film surface.

11. The memory according to claim 10, wherein a bit line is connected to said memory element and wherein an electric current is flowed through the bit line to apply the magnetic field in the in-plane direction of the film to the memory element.

12. The memory according to claim 8, wherein said magneto-resistance effect film further comprises a second magnetic region formed in granular shape between the other of said first and second magnetic layers and the non-magnetic layer and having a spin polarization greater than that of the other of the first and second magnetic layers, and wherein said second magnetic region is exchange-coupled with the other of said first and second magnetic layers.

13. The memory according to claim 12, wherein in a state without application of an external magnetic field, magnetization in the one of said first magnetic region and second magnetic region of said magneto-resistance effect film is directed in a direction perpendicular to the film surface, wherein in a state without application of an external magnetic field, magnetization in the other of said first magnetic region and second magnetic region is directed in a direction inclined from the direction perpendicular to the film surface, and wherein in a state with application of an external magnetic field in the direction perpendicular to the film surface, magnetizations in the first and second magnetic regions are directed both in the direction perpendicular to the film surface.

14. The memory according to claim 8, wherein the non-magnetic layer of said magneto-resistance effect film consists of an insulator.

15. The memory according to claim 8, wherein in a state without application of an external magnetic field, magnetization in the first magnetic region of said magneto-resistance effect film is directed in a direction perpendicular to the film surface.

16. The memory according to claim 8, wherein in a state without application of an external magnetic field, magnetization in the first magnetic region of said magneto-resistance effect film is directed in a direction inclined from a direction perpendicular to the film surface and wherein in a state with application of an external magnetic field in the direction perpendicular to the film surface, magnetization in the first magnetic region is directed in the direction perpendicular to the film surface.

17. The memory according to claim 8, wherein the one of the first and second magnetic layers of said magneto-resistance effect film consists of an amorphous alloy of a rare-earth-metal-sublattice-magnetization-dominant rare earth and a transition metal, and wherein said first magnetic region consists of a transition metal.

* * * * *